United States Patent [19]

Wells et al.

[11] Patent Number: 5,566,194
[45] Date of Patent: Oct. 15, 1996

[54] METHOD AND APPARATUS TO IMPROVE READ RELIABILITY IN SEMICONDUCTOR MEMORIES

[75] Inventors: Steven Wells, Citrus Heights; Neal Mielke, Los Altos Hills, both of Calif.

[73] Assignee: Intel Corporation, Santa Clara, Calif.

[21] Appl. No.: 471,139

[22] Filed: Jun. 6, 1995

Related U.S. Application Data

[63] Continuation of Ser. No. 969,756, Oct. 30, 1992, Pat. No. 5,452,311.

[51] Int. Cl.$^6$ ............................................. G06F 11/00
[52] U.S. Cl. ........................ 371/51.1; 395/183.18; 371/5.1
[58] Field of Search ........................................ 371/81.1

[56]    References Cited

U.S. PATENT DOCUMENTS

| | | |
|---|---|---|
| 4,642,759 | 2/1987 | Foster . |
| 4,644,494 | 2/1987 | Muller . |
| 4,763,305 | 8/1988 | Kuo . |
| 4,802,117 | 1/1989 | Chrosny et al. . |
| 4,896,262 | 1/1990 | Wayama et al. . |
| 4,958,315 | 9/1990 | Balch . |
| 5,012,425 | 4/1991 | Brown . |
| 5,067,128 | 11/1991 | Nakane . |
| 5,070,474 | 12/1991 | Tuma et al. . |
| 5,077,737 | 12/1991 | Leger et al. . |
| 5,131,089 | 7/1992 | Cole . |
| 5,200,959 | 4/1993 | Gross et al. . |
| 5,268,906 | 12/1993 | Free . |

FOREIGN PATENT DOCUMENTS

| | | |
|---|---|---|
| 2088442 | 7/1993 | Canada . |
| 0175458A2 | 3/1986 | European Pat. Off. . |
| 0392895A2 | 10/1990 | European Pat. Off. . |
| 2251324 | 1/1992 | United Kingdom . |
| 2251323 | 1/1992 | United Kingdom . |

OTHER PUBLICATIONS

Gross, Stephen J. and Jorge–Luis Sanchez, "Solid–State Mass Storage Arrives", Product Feature, Memory Card Systems & Design, Jul./Aug. 1992.

Tanenbaum, Andrew S., "Structured Computer Organization: Third Edition", Chapter 3, Section 3.4, Prentice Hall, Inc., 1990, pp. 115–119.

Robinson, Kurt, "Trends in Flash Memory System Design", Wescon Conference Record, Nov. 1990, pp. 468–472.

*Primary Examiner*—Vincent P. Canney
*Attorney, Agent, or Firm*—Blakely, Sokoloff, Taylor & Zafman

[57]    ABSTRACT

Apparatus for controlling a length of a period during which the output circuitry of a memory array waits before latching the output data including apparatus for detecting the presence of an error in data read from an memory array, apparatus for providing a first value to determine a wait period, apparatus responsive to the detection of an error for providing a second value, apparatus responsive to the first value for generating a signal to latch a data output from the memory array after a first period and responsive to the second value for generating a signal to latch a data output from the memory array after a second period.

12 Claims, 7 Drawing Sheets

|   |   |   |   | Parity |
|---|---|---|---|--------|
| 1 | 1 | 0 | 1 | 1 |
| 1 | 1 | 1 | 1 | 0 |
| 0 | 0 | 1 | 0 | 1 |
| 1 | 0 | 0 | 0 | 1 |

Parity 1 0 0 0

FIGURE 8

METHOD AND APPARATUS TO IMPROVE READ RELIABILITY IN SEMICONDUCTOR MEMORIES

This is a continuation of application Ser. No. 07/969,756, filed Oct. 30, 1992, now U.S. Pat. No. 5,452,311.

BACKGROUND OF THE INVENTION

1. Field Of The Invention

This invention relates to computer memory arrangements and, more particularly, to methods and apparatus for slowing the read operation of selected memory cells in order to obtain accurate data.

2. History Of The Prior Art

Modern computer systems make extensive use of long term memory. Typically this memory is provided by one or more hard (fixed) disks. A hard disk is an electro-mechanical device which includes one or more flat circular magnetically-coated disks fixed to rotate rapidly about a central axis. A mechanical arm driven by electrical signals places a magnetic head over each side of each disk to write to positions on the disk or to read from those positions. These positions lie in sectors, a number of which form one complete track on one side of a disk. Each sector is capable of storing a fixed number of bytes of data (typically 512 bytes). Depending on formatting, a single side of a disk may have over six hundred tracks. A typical disk drive used in personal computers today is capable of storing forty megabytes or more of data.

Such hard disk drives are very useful and have become almost a necessity to the operation of personal computers. However, such electro-mechanical drives do have their drawbacks. They are relatively heavy and increase the weight of a computer, especially a portable computer, significantly. They also are relatively bulky and require a significant amount of space within a computer. Their use requires a significant amount of the power and in a portable computer leads to significant battery power consumption. More importantly, electro-mechanical hard disk drives are very susceptible to shock. A hard drive within a portable computer which is dropped is quite likely to cease functioning. This can cause a catastrophic loss of data.

CONTEXT IN WHICH THE PRESENT INVENTION IS USED

Recently, forms of long term storage other than electro-mechanical hard disks have become feasible for use in computers. One of these is flash EEPROM. Flash EEPROM memory is comprised of a large plurality of floating-gate field effect transistors arranged as memory cells in a typical row and column memory array. A flash memory cell, like a typical EPROM cell but in contrast to DRAM memory, retains information when power is removed. Flash EEPROM memory has a number of characteristics which adapt it to use as long term memory. It is light in weight, occupies very little space, and consumes less power than electro-mechanical disk drives. More importantly, it is especially rugged. It will withstand without adverse effects repeated drops each of which would destroy a typical electro-mechanical hard disk.

A peculiarity of flash EEPROM, however, is that it is not reprogrammable until it has been erased. Flash EEPROM is erased by applying a high voltage simultaneously to the source terminals of all of the transistors (cells) used in the memory or some sub-portion thereof. Because these source terminals are all connected to one another by metallic busing in the array, the entire array must be erased at once. While the data in an electro-mechanical hard disk may be modified by writing over the area of the disk holding the information being changed, with a flash memory array all of the valid information must first be removed from the portion to be erased. Then all of the valid information which was erased must be rewritten once that portion of the array has been erased. As may be appreciated, such a process (between one and two seconds) used to update individual entries as the data changes would significantly slow the operation of any computer system using flash memory in place of an electro-mechanical hard disk and would seem to preclude the use of flash EEPROM for rapidly changing data.

For this reason a new arrangement for erasing and rewriting the flash EEPROM array has been devised. Such a new arrangement is disclosed is U.S. patent application Ser. No. 07/969,131, entitled Method and Circuitry for a Solid State Memory Disk, S. Wells, filed on even date herewith, and assigned to the assignee of the present invention. In that arrangement, a typical long term storage array is comprised of flash memory arranged in a series of independently-erasable blocks. Each of the blocks of the array typically holds 128 kilobytes of data, sufficient to hold 256 sectors of information normally stored on the tracks of an electro-mechanical hard disk drive. One embodiment with 240 individually-erasable blocks holds about the same amount of data as does a thirty megabyte electro-mechanical hard disk.

To overcome the slow erase problem, data is written to any block of the flash memory array which has space available without attempting to erase the old data. Thus, data is written to an empty position in the array no matter what the sector address of the data or the physical address on the block. A lookup table is kept which records the logical address and the physical position of the data on the block. This arrangement of the array allows a first block to be written sector by sector, a second block to be written in the same sequential manner, and so on. When the data in a sector changes so that the sector needs to be rewritten, the data is written to a new physical position, the data in the lookup table is changed to record the new physical position along with the logical sector number, and the first position at which the data was written is marked as invalid (dirty). After some period of time, a sufficient number of blocks will be filled that it will be desirable to release space by moving the valid information from some especially dirty block to some other block and erasing the entire block from which the valid information has been read. This is referred to as "cleaning up a block" and has the effect of freeing up an additional number of sectors equal to all of the sectors on the erased block which have previously been marked as dirty.

This has the advantage that the erasure of blocks may occur in the background. That is, erasure may be arranged to occur when the facilities of the array are not otherwise occupied with reading and writing. In this manner, the external host which is writing to and receiving information from the flash array is typically not aware that an erasure is taking place even though the erasure requires one or two seconds.

A problem exhibited by flash memory is that it tends to have a limited life in use. This would seem to be due to the floating-gate transistors of the array requiring longer to switch after undergoing some number of switching operations. This number is quite large; it has been estimated that although switching begins to take longer after approximately ten thousand switching operations, greater than one hundred thousand switching operations are required before the extended switching time has any affect on system operation.

Even so, the method by which data is written to the array subjects the memory transistors to a large number of switching operations.

It has been discovered that probably over 95% of data retention failures are caused by changes in the amount of time required to read out the condition stored by a typical memory transistor of the array after a very large number of switching operations have occurred within the chip. It has also been determined that this condition may be overcome if the time to latch the values read from the memory cell is simply increased since the circuits involved are analog circuits. In particular, a memory cell might still be functioning and storing the correct value but the time required for the device to switch and provide the correct output value has been extended from 90 nanoseconds to 500 nanoseconds. In many cases the array will still perform as well as ever though one or more transistor memory cells may require a longer switching time. It would be very advantageous if the system were able to extend the switching times for such memory transistors.

SUMMARY OF THE INVENTION

It is, therefore, an object of the present invention to provide a method and apparatus for detecting the presence of a failure by a flash memory array caused by a transistor cell which has failed to switch because of insufficient time.

It is another more specific object of the present invention to provide a method and apparatus for detecting the presence of a failure by a flash memory array and correcting that failure by extending the switching time for a transistor cell which has failed to switch.

These and other objects of the present invention are realized in apparatus for controlling a period during which the output circuitry of a memory array waits before latching the output data comprising means for detecting the presence of an error in data read from a memory array, means for providing a first value to determine a wait period, means responsive to the detection of an error for providing a second value, means responsive to the first value for generating a signal to latch a data output from the memory array after a first period and responsive to the second value for generating a signal to latch a data output from the memory array after a second period.

These and other objects and features of the invention will be better understood by reference to the detailed description which follows taken together with the drawings in which like elements are referred to by like designations throughout the several views.

BRIEF DESCRIPTION OF THE DRAWINGS

FIG. 8 illustrates a simple error detection and correct code useful in explaining the invention.

NOTATION AND NOMENCLATURE

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. In all cases the distinction between the method operations in operating a computer or a portion thereof and the method of computation itself should be borne in mind. The present invention relates to apparatus and to method steps for operating a computer in processing electrical or other (e.g. mechanical, chemical) physical signals to generate other desired physical signals.

DETAILED DESCRIPTION

Figure 1:
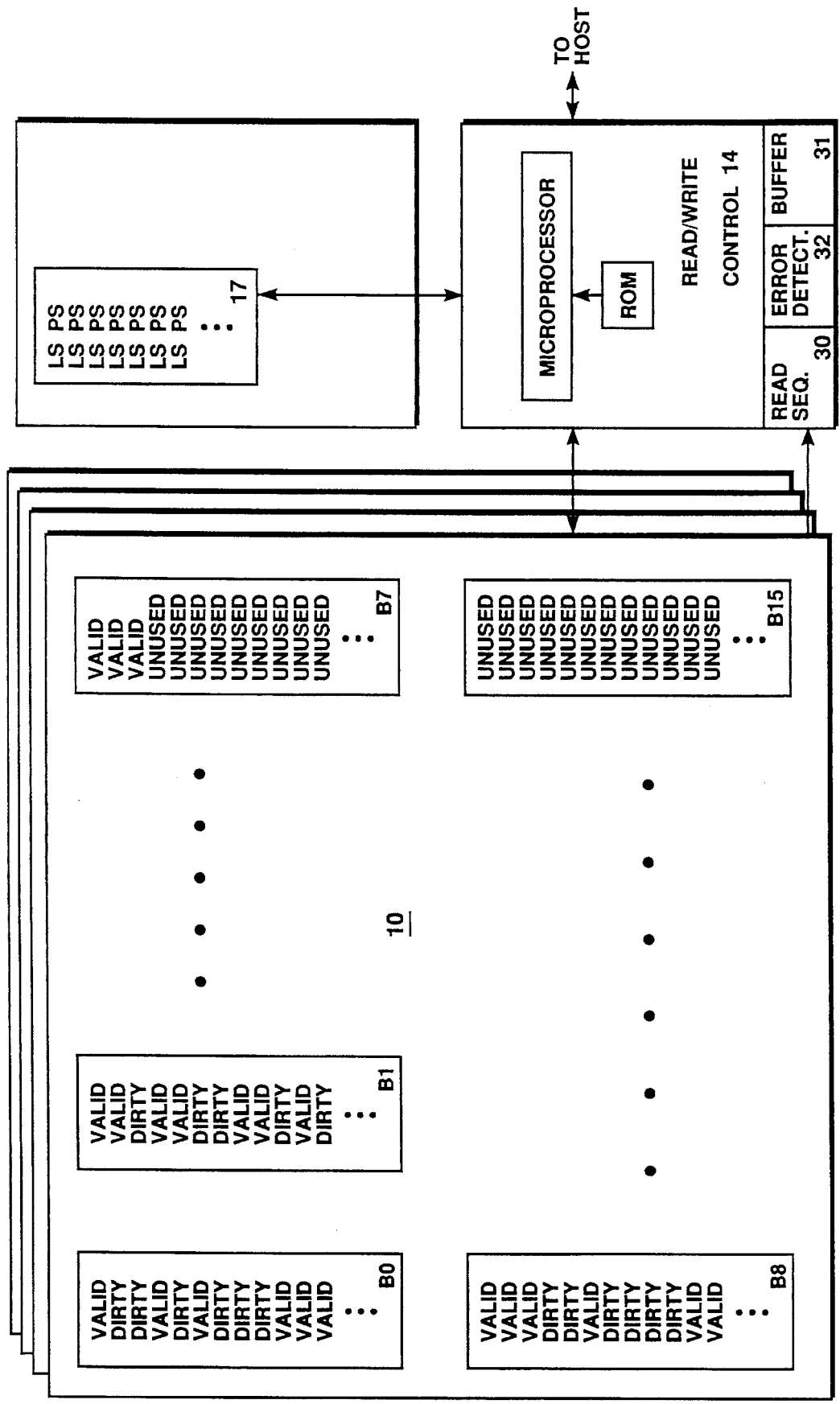
FIG. 1 is a block diagram illustrating the layout of a flash memory array in which the present invention may be utilized.

Referring now to FIG. 1, there is illustrated in block diagram form a flash EEPROM memory array 10 in which the present invention may be practiced. The array 10 includes a plurality of blocks B0–B15 of flash EEPROM memory. Each block includes floating-gate field effect transistor memory cells (not shown) arranged in typical row and column fashion and having circuitry arranged for selecting any particular block of memory and any particular row and column so that the memory device at that position may be written or read. The details of the layout of transistor memory arrays and the associated accessing circuitry are well known to those skilled in the art and are, therefore, not shown here.

Flash EEPROM memory is essentially an EPROM array with facilities provided so that when divided into separately erasable blocks in the manner illustrated an entire block may be erased by a high voltage value applied simultaneously to the source terminals of all the memory transistors of the block. Such an erasure places each of the cells in the one condition. When in that condition, a zero or a one may be written to a cell. A one leaves the cell in the same one condition while a zero switches the cell to the zero condition. A cell cannot be switched back from the zero condition to the one condition without the application at its source terminal of the high value of voltage required for erasure. Since all source terminals of the memory transistors are joined together, a cell in a zero state remains in that state until the entire block of the array is erased once again.

In the array 10 illustrated in FIG. 1, blocks B0–B15 of memory are shown positioned on a first chip 11 of the array 10. Additional silicon chips 11 each hold additional blocks of the array 10 to provide a total of 240 blocks in one embodiment.

Once any one of the blocks has been erased, data may be written to any position on the entire block. When a host begins writing data to be stored in the array to some block of the array, the data to be stored in the array 10 is written sequentially, sector by sector, to the first block having free space until that block has been filled with data. Then writing proceeds to the next sequential block having free space. At any point after writing is completed, the information may be read back from the array 10 by interrogating the block and sector at which the data is stored.

In accordance with the arrangement described above, the data is stored in sectors which are similar to the sectors utilized in storing data on the typical hard disks of the prior art except that the sectors may be of any size (as will be explained below). When new information is to be written to a sector which already contains information, the new information is written to a new or newly-erased free space on some one of the blocks of the array 10. This, rather than writing over the old information, occurs because the old information can only be rewritten if the entire block on which it is stored is erased. Consequently, the new information is written to a new position on a different unfilled block (e.g., block B7), and the old position is marked invalid (dirty) by writing zeroes at the entry which may be done without erasing the block of the array.

Because of this arrangement by which data is replaced, the sector number which is used to indicate where data is stored is really a logical sector number rather than a physical sector number used to arrange data on the typical electromechanical hard disk. In order to allow the use of logical sector numbers, a lookup table 17 listing logical sector numbers along with the physical position in the array 10 is utilized with the array 10 so that the data may be recovered.

Because of this arrangement by which data is replaced, each block of the array will after some time have a number of entries which are marked invalid and cannot be used for storage. Consequently, as the array 10 fills with data, a point will come when it is necessary to clear out invalid information from a block in order to provide space for new information to be stored. Typically, the dirtiest block of the array 10 is chosen for cleanup. This allows the smallest amount of valid data to be moved from the block to be erased to another block of the array. Once the valid information is written to another block and the new physical addresses are recorded in the lookup table 17, the block from which the information was read is erased. It is then placed back in operation as an entirely clean block of free space. In order to allow this cleanup operation to occur, some number of blocks must be kept in reserve to be used when cleanup is necessary.

The control on reading, writing, and erasing the memory array 10 is accomplished by a read/write control circuit 14. The read/write control circuit 14 includes among other circuit elements a microprocessor which may implement various commands stored in read only memory. Among these commands are those necessary to construct and modify the lookup table 17 utilized for determining the position of data in the array 10 and the process for accomplishing cleanup of a dirty block of the memory array 10. As will be understood from the following description, the microprocessor may also be utilized to carry out certain processes used in the present invention.

Figure 2:
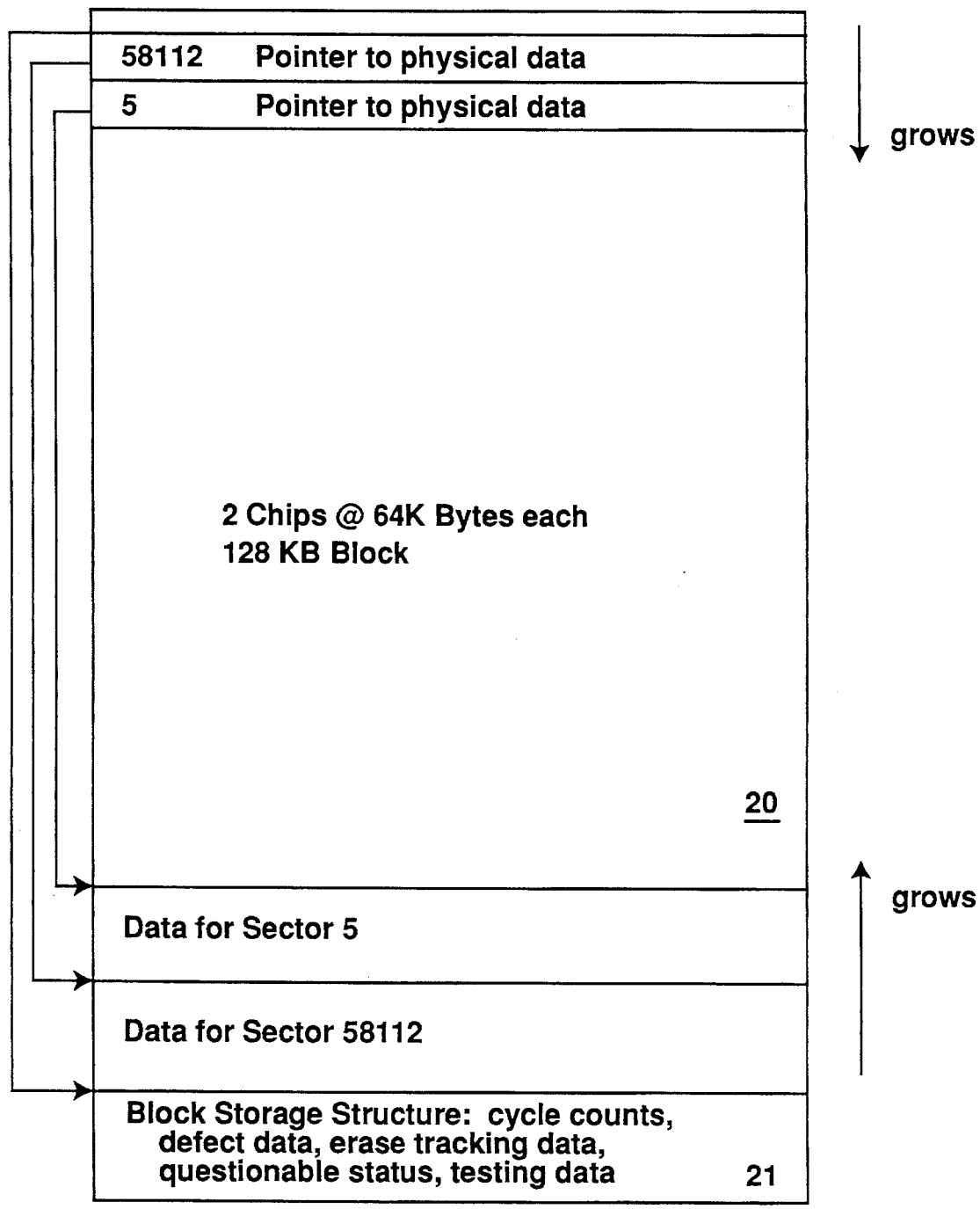
FIG. 2 is a block diagram illustrating the pattern of storage of information on a single block of a flash memory array such as that illustrated in FIG. 1.

FIG. 2 illustrates one logical arrangement used for an individual block in order to obtain the advantages discussed above. FIG. 2 is an idealized drawing useful in understanding the way data is stored on each block of the array 10. FIG. 2 illustrates a typical block 20 as a rectangle. The rectangular area includes a plurality of transistor devices arranged to provide the 128 K bytes of storage which each block provides. The individual transistors and the various column and row select lines and other conductors for operating the block are not illustrated but are well known to those skilled in the art of designing flash memory.

As may be seen in FIG. 2, data is stored in the block 20 beginning at the top of the block and at the bottom. At the top of the block 20 are stored identification fields called sector translation tables or headers which include the logical sector numbers used by the operating system as addresses for the data. For example, a first sector number 58112 is stored in the first header at the top of the block 20. With the sector number in the header is stored a pointer value. Other information (not shown) such as an indication of validity may also be stored in the header. The pointer value points to a physical address on the block 20 which is an offset from the beginning of the block at which the data for logical sector 58112 is stored. An arrow in FIG. 2 illustrates this physical position at which the first bits of data for the logical sector are stored. Since the amount of data to be stored is known at the time of a write operation, in one embodiment of the block 20, the data is stored by writing down to the next previously stored data. In the case of logical sector 58112 which is the first sector on the block 20, the data is written from the address at the address stored with the sector number 58112 to a point at the beginning of the data area which is marked by a beginning pointer value illustrated by an arrow extending from the upper left hand corner of the block 20.

The amount of data written to the logical sector 58112 is not fixed and may vary. However, in the typical interface between the computer system and the storage system, data is assigned to storage in sectors of 512 bytes. FIG. 2 shows a second logical sector 5 and its pointer directed to a physical position on the block 20 which stores the first bit of the data for sector 5. The data for sector 5 is stored in an area which begins just above the most recent data sector written (sector 58112) and extends downward so that the last row of the new data sector lies in the row just above the first row of sector 58112. Since each new sector of data is written in all of the rows immediately above the last-written sector, only a trivial amount of data space (averaging one byte) is wasted in the block storage scheme of the arrangement. When the data being sent to storage is compressed, the amount of storage space normally left empty in a fixed size storage arrangement may be eliminated. This should be contrasted with the very large amount of unused space typical to an apparently full hard disk.

The unusual arrangement for rewriting data used by a flash memory array requires that the memory allocation system continually make new or newly-erased memory available for data to be written and rewritten. This requires that some number of blocks always be available in order to allow blocks holding invalid data to be cleaned up and their dirty sectors released.

As was pointed out above, the physical position of the sector number is stored in a lookup table 17 (which is preferably held in static random access memory 16 on the silicon chip which holds the other components of the array 10) with the chip number, the block, and other information (such as row and column addresses) for retrieving the data. The data stored in any sector of the block 20 may be retrieved by retrieving the physical position of the logical sector number from the table 17, going to the position on the block 20 where the sector number is stored, and retrieving the pointer to the beginning position of the data and the pointer to the beginning position of the sector whose number is stored immediately above the sector number being retrieved. These two values determine the starting and ending positions for the sector the data of which is sought.

A problem which occurs in the operation of any memory array is that attempts to read, write, and erase that memory sometimes fail. Failures may occur for many reasons. Some of these failures may be due to the physical failure of the array while others are caused by some form of extraneous signal. It has been determined that a great proportion of read errors in a flash EEPROM memory array are caused by the transistors of the memory cells taking longer than the prescribed period to provide an output signal indicative of the state of the cell. Although the state of the cell may be correctly varied and the correct condition stored, the time to read appears to lengthen with the number of switching operations conducted. Consequently, the time required for the signal produced at the output driver to settle to its final state lengthens.

Figure 3:
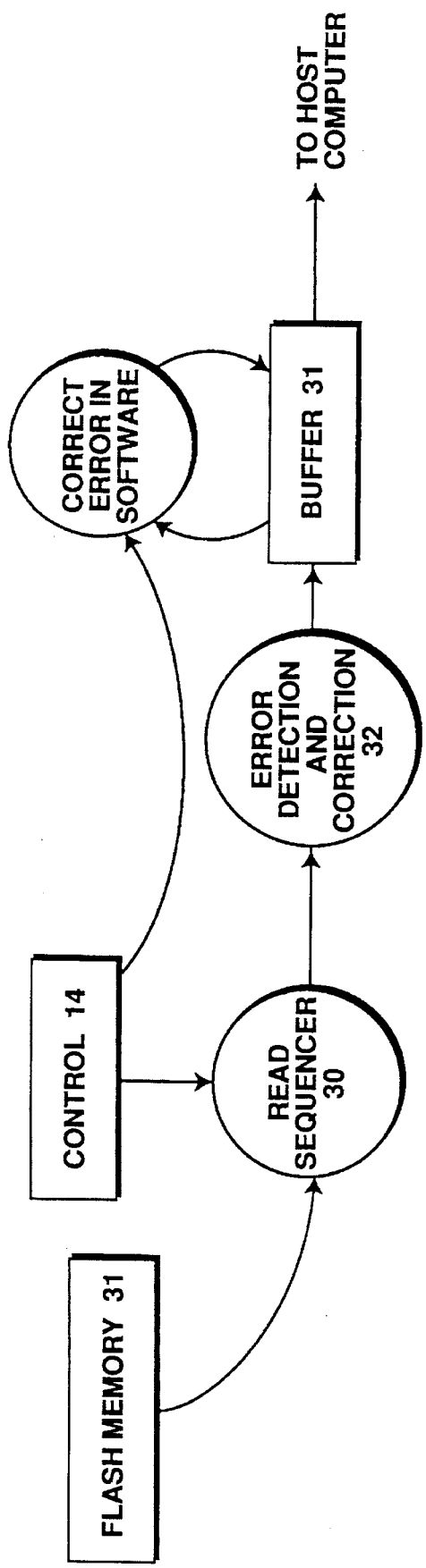
FIG. 3 is a diagram illustrating apparatus in accordance with the invention for detecting and remedying failures due to extended switching times of memory cells.

FIG. 3 illustrates an arrangement in accordance with the present invention for overcoming errors caused by the lengthening of the switching time for the memory cells of a flash EEPROM array. When an attempt is made to read a sector of data, the data is first read from the block of the flash array 10 to a read sequencer circuit 30 illustrated in FIG. 3. The read sequencer circuit 30 accomplishes the purposes of this invention by controlling the period of interrogation for the memory cells so that when a read error occurs in a particular sector, an error caused by a slowdown in the ability of the memory cells to provide an output may be overcome. The read sequencer 30 is provided the address of a sector of information to be read and causes that information to be read and stored in a buffer RAM 31. During the read operation, the read sequencer 30 stores certain information related to the particular sector being read until it has been determined that the information read is correct. The correctness of the information is determined at an error detection circuit 32 which lies in the path to the buffer RAM 31 and functions in accordance with the dictates of the prior art. The read sequencer 30, the buffer RAM 31, and the error detection circuit 32 may be a part of a controller circuit 14 illustrated in FIG. 1.

In one embodiment of the invention, four bytes of error detection and correction code are stored with each sector of data on the flash EEPROM array. This error detection and correction code allows detection and correction of single and multiple bit errors. Error detection and correction code of this type is well known to those skilled in the art and is widely used in protecting data stored on electro-mechanical hard disks. Examples of error correcting code and the operation such code performs are detailed, for example, in *Practical Error Correction Design For Engineers*, Revised 2d Edition, Glover and Trent, published by Cirrus Logic Press, copyright 1990. If the circuit 32 detects an error in the data read, it generates a signal indicating that an error has occurred.

FIG. 8 illustrates a simplistic method of error detection and Correction which may be utilized for errors in the two storage arrangements described above. The method is illustrated to explain the problems associated with detecting and correcting errors in row and column organized memory arrays. For this purpose, only four rows and four columns of memory cell positions are shown. The method utilizes a parity checking arrangement in which each row and each column are assigned values depending on whether the total of one values stored in the particular row or column is an even or odd number. If the total of one values is odd as in the first, third, and fourth rows, a one is stored with the detection and correction code to bring the value to an even number. If the total is even as in the second, third, and fourth columns, a zero is stored with the detection and correction code so that the total remains an even number. These error checking bits are typically stored in the sector with the data as the data is written. In one embodiment of the invention, four bytes of this type of error checking and correcting data are stored. When the data is read from the sector, the parity check bits of the detection and correction code may be checked against the values of the data read. It will be seen that if a single bit error has occurred, the parity bits for a single column and a single row will not match the total of the values read. For example, if the one value stored at the intersection of the third row and the third column is read as a zero, then the parity value for the row will be zero while the stored parity bit for the row is one; and the parity value for the column will be one while the stored parity bit is a zero. These two failures during an error checking comparison show that the bit at the intersection is incorrect and allow that bit to be corrected to the proper one value.

As may be seen from FIG. 8, it is also possible with the simple parity checking error correction and detection scheme illustrated to detect multiple errors which occur in a single row and multiple errors which occur in different rows. It may be possible to correct some of these errors but others will be uncorrectable with the scheme illustrated. For example, if two bits fail in the third column, each of the rows in which the bits fail will exhibit an incorrect parity bit while the column will have the correct parity bit. Consequently, even though it is clear that errors have occurred in particular rows, it is not known which bits in the rows are in error so a correction cannot be made with this simple scheme. Various more complicated error detecting and correcting schemes are available, and such schemes will go much further in detecting and correcting errors. Although it is expected that more complicated schemes than that shown would be used with the present invention, such schemes are not a part of this invention and, therefore, are not discussed further.

Figure 4:
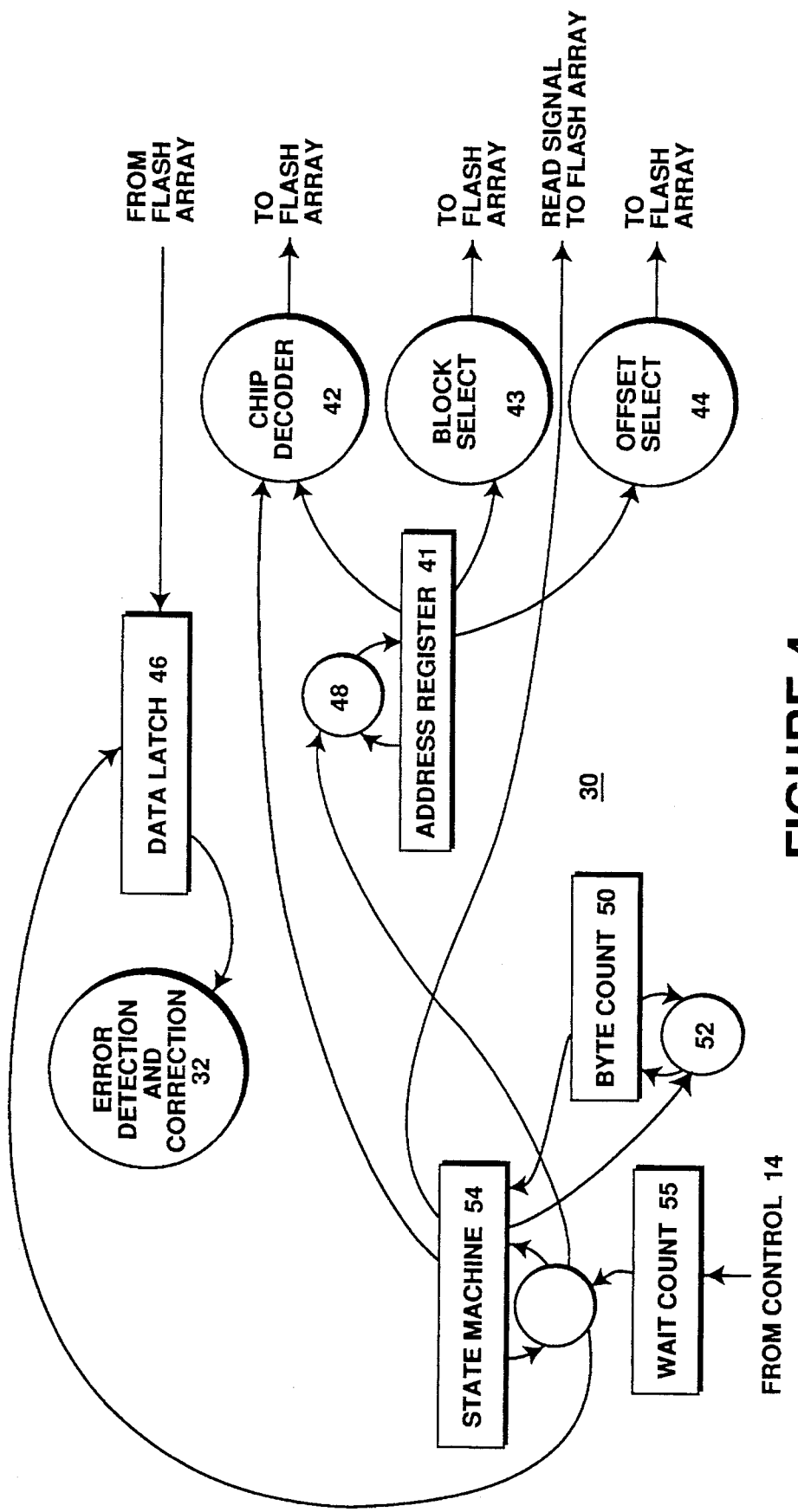
FIG. 4 is a more specific diagram illustrating a portion of the apparatus of FIG. 3 for detecting and remedying failures due to extended switching times of memory cells.

FIG. 4 is a diagram of the read sequencer 30 illustrated in FIG. 3. The read sequencer 30 includes a number of circuit elements such as registers which store information and circuitry which causes certain operations to occur. The various portions of the read sequencer 30 operate to cause the occurrence of the events hereinafter described.

The read sequencer 30 illustrated in FIG. 4 includes a register 41 which stores the address which is to be read from the block of the array. In one embodiment of the invention, this includes the chip number of the silicon substrate upon which the particular portion of the block being interrogated resides, the block address, and the offset into the block at which the data may be found. These values are provided to the register 41 of the read sequencer 30 by the read/write control circuit 14 illustrated in FIG. 1. The read/write control circuit 14 derives this information from the pointer values stored with the sectors on the block from which data is sought. The address register 41 provides this information to a chip decoder circuit 42 which selects the appropriate chip, a block select circuit 43 which selects the appropriate block, and an offset select circuit 44 which selects the particular data at the offset on the block. The circuitry for accomplishing these various elements of the address decoding operation are well known to those skilled in the art of computer design and are therefore not discussed in detail here. The first byte of data at the particular address is read from the flash memory array. As each byte is read, it is transferred from the flash memory cells to the output of the array and latched in a data latch 46, the period at which each byte is latched after the initiation of the read signal being under control of the read sequencer 30. Initially this period is set to be the normal (default) output period by a value placed in a wait count latch 55. Each byte of the data in the data latch 46 is transferred to the error detecting circuitry 32 shown in FIG. 3 where it is accumulated in a buffer until a complete sector has been read.

The read sequencer 30 also includes an incrementer circuit 48 constructed in a manner well known to those skilled in the prior art which sequentially advances the address held in the register 41 as each byte of data is read from the addressed sector of the block of memory being read. Another register 50 stores an initial count of the number of bytes to be read from the sector, the number being determined from the beginning and ending addresses of the sector and furnished by the circuit 14. A decrementer circuit 52 constructed in a manner well known to those skilled in the art is associated with the count register 50. The decrementer circuit 52 reduces the count held in the register 50 as each byte of data is read from the addressed sector.

Figure 7:
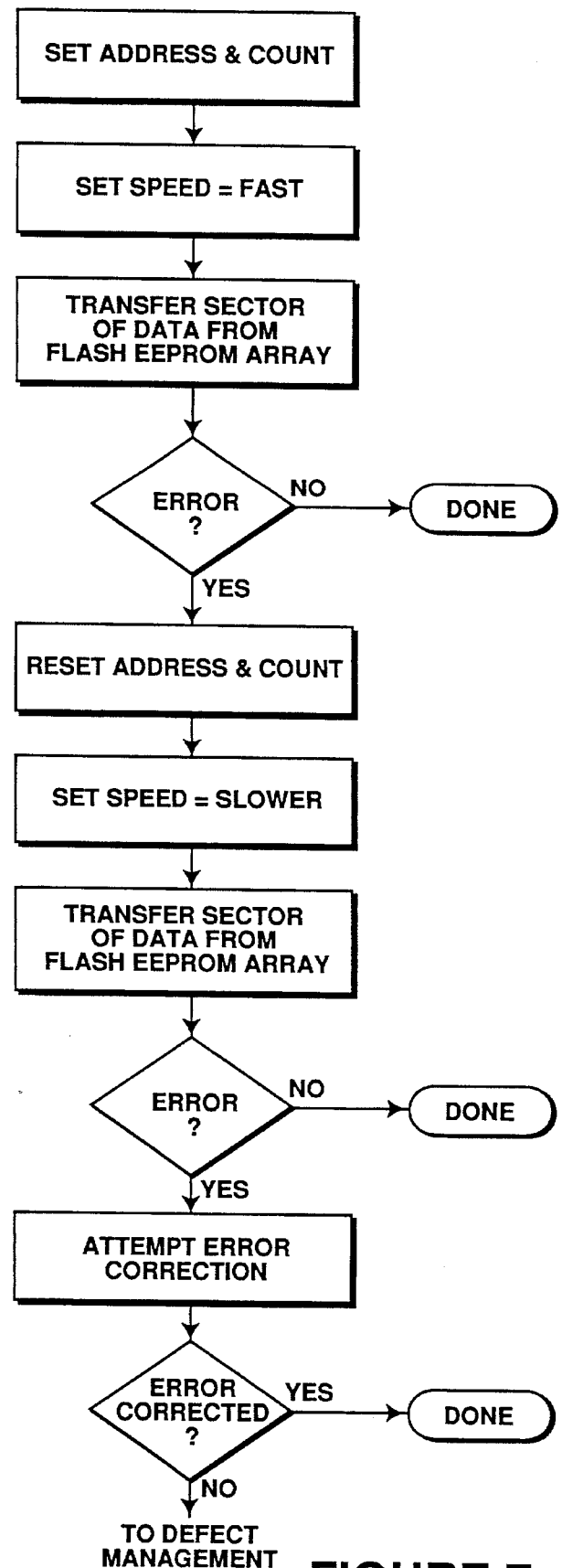
FIG. 7 is a flow chart illustrating the steps of a method of the invention.

The operation of the invention will be understood by referring to FIG. 4 and to the flow chart illustrated in FIG. 7. In operation, the read sequencer 30 receives an address and the length of the sector from the circuit 14. A state machine 54 is also set by the controller 14 to provide the default value for the time to latch the output read from the sector of the array. The sequencer then begins the read operation by selecting the first byte of information to be read at the address indicated by the pointer stored in the block with the logical sector number. The byte of data is read out of the block of the array and latched by the latch 46. The period after the read signal is applied to the cells of the memory array until the data is latched is controlled by the state machine 54 which receives the wait count from the latch 55. The period is initially the normal fast time for read out of the memory cells. The incrementer circuit 48 increases the address held in the register 41 by one byte in the sequence of addresses so that the next byte in the sector will be read. At the same time, the decrementer circuit 52 reduces the count of bytes to be read held in the register 50 by one. Data is read byte by byte until the entire sector has been read out including its error correcting code and transferred to the error detection circuit 32 where the correctness of the entire sector of data is determined. The circuit 14 tests the status of the error detection circuit 32 to determine whether an error has occurred in that sector. Presuming that the data read is correct as determined by the error detection circuit 32 using the error detection and correction code stored with the data, the circuit 14 is done with that sector of data and moves on to accomplish its next operation; and the latching period for reading data remains at the normal time for the array cells, e.g., 90 nanoseconds depending on the particular circuitry involved.

If, however, the error detection circuit 32 signals that there is an error in the data which has been read, then the circuit 14 resets the address in the address register 41 to the initial address of the sector at which the incorrect data was read and provides a new wait count to the latch 55. This wait count controls the state machine 54 to lengthen the latching period for the data received from the array 10 by the data latch 46. In effect, as a first step where an error is found, the read sequencer 30 retries the read of the particular sector of information to determine whether, by extending the time (the settling time or access time of the chip) at which the data read from the array is latched, correct information will be read.

Figure 5:
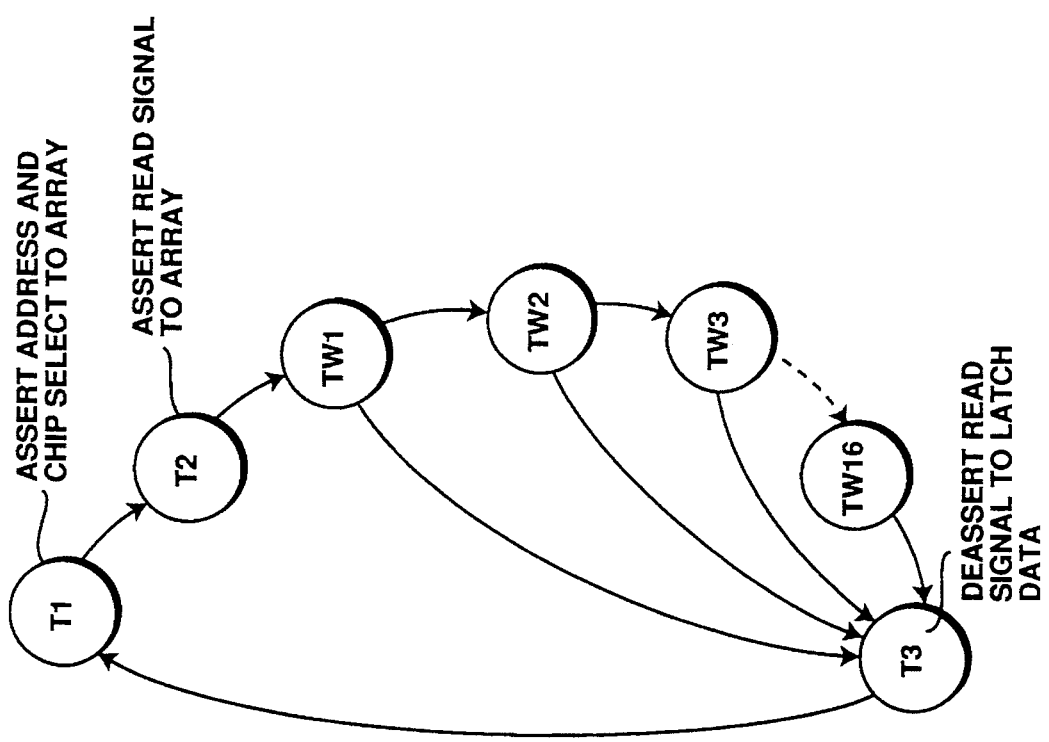
FIG. 5 is a diagram illustrating the various states of a portion of the circuitry illustrated in FIG. 4.

The state machine 54 operates in the general manner illustrated in FIG. 5 to extend the time at which the data read from the array is latched in the case of an error. The state machine 54 has a first state T1 in which it transfers the addresses to the address decode circuitry causing the data address and the chip select address to be presented to the array. In any case, at a state T2, the read signal is asserted to the array; and the address of the array held by the register 41 is interrogated to read the data byte (or word depending on the circuitry) stored there. The state machine 54 then waits for up to sixteen count periods for each byte of data in the sector. The length of the count during which the state machine 54 waits is held in the wait count register 55. Typically, this count is determined by the fastest read time for the array (e.g., 100 nanosec.); this value is illustrated at a state TW1. After each attempt by the read sequencer to read the data in the entire sector correctly, the count is increased. As the count is increased in the register 55, the state machine 54 moves through the states TW2 and TW3 to the state represented by the count stored. When the time selected for the wait count has passed, the state machine 54 returns to a state T3 at which it generates a signal to cause the latch 46 to latch the data being read from the sector. Each of the intervals (states TWX) provided may be equal to 25 nanoseconds so that a total wait of up to 400 nanoseconds may be implemented. In fact, in one embodiment of the invention, a first error signal by the error detection circuit 32 generates an input to the wait count register to set the value of the wait by the skate machine 54 to the maximum wait period of 400 nanoseconds. Thus, only one retry operation is attempted after the data is found to have errors.

After the wait of 400 nanoseconds, the state machine 54 moves back to the T3 state at which the data is latched by the latch 46. If the extension of the latching period generates correct data in which no error is discovered by the error detection circuit 32, the state machine 54 cycles to its initial conditions and moves to the state T1 at which the next address is sent to the array and the next sector is read using the minimum number of wait states.

It should be noted that although the wait state machine 54 may be implemented in hardware and function in the manner described as a typical state machine, in one embodiment the state machine 54 is implemented as software stored in read only memory and carried out as a process by the microprocessor of the controller 14.

Figure 6:
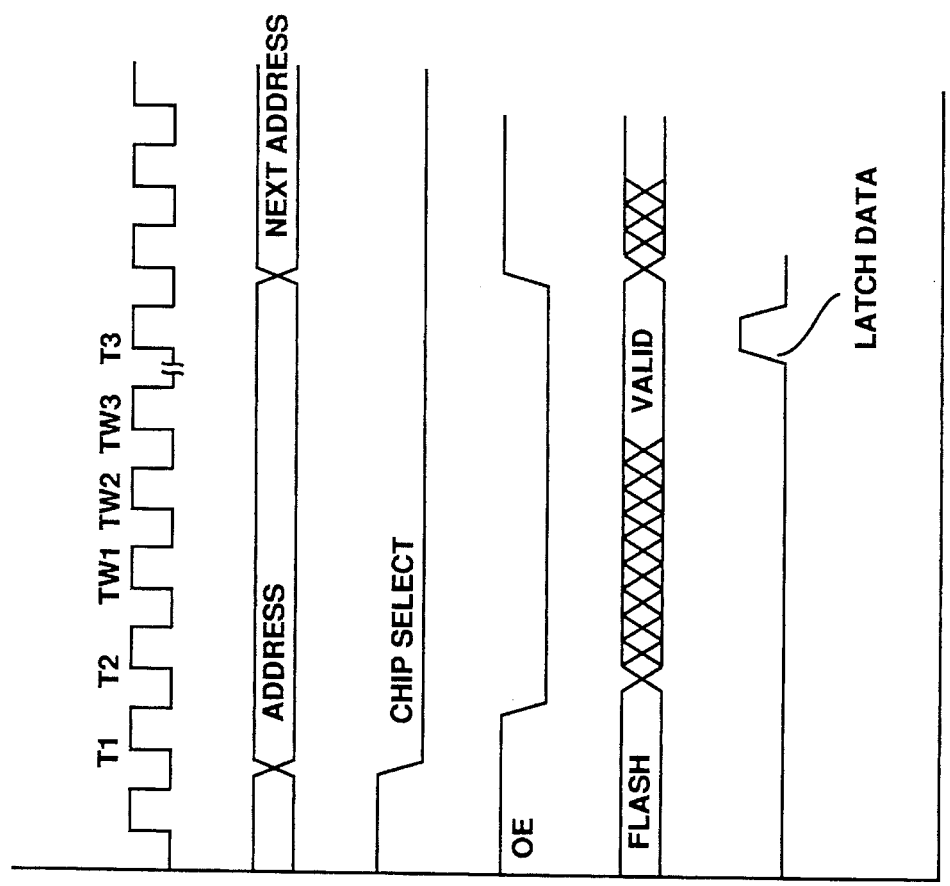
FIG. 6 is a timing diagram illustrating the operation of the circuit of FIGS. 3 and 4.

FIG. 6 is a timing diagram illustrating the general operation of the state machine 54. As may be seen, at time T1 the chip select signal is asserted negatively and the address is asserted. At a time T2, an output enable signal is generated so that read signals are generated to cause data to appear at the output lines of the array. In one embodiment wait states are optional. It is then possible to read the flash EEPROM array data without wait states in which case data is presented at T3. Data is illustrated being transferred from the array beginning at T3 (if no wait states are specified) or at wait period TW1 and continuing through wait period TWX (X can be 1 through 16) at which the value held in the wait counter 56 causes the state machine 54 to switch to state T3. At state T3, the data is latched as the read signal OE, transitions to a high state, and is furnished to the error detection circuit 32. The state machine 54 recycles through its various states to transfer more data.

As is illustrated in FIG. 7, if the lengthening of the readout period does not correct the error so that the error detection circuit 32 finds that the data is still incorrect, then the operation moves to attempt to correct the error using the various error correction algorithms available. These algorithms may be stored in read only memory and carried out in software under control of the microprocessor of the control circuit 14. The manner in which this is accomplished is not a part of the present invention. The details of managing defects which are detected and are correctable and those which are not correctable is considered in detail in U.S. patent application Ser. No. 07/969,749, entitled *Method Of Managing Defects In Flash Disk Memories*, S. Wells et al, filed on even date herewith, and assigned to the assignee of the present invention.

Thus, as has been described, the apparatus of the present invention provides means for lengthening the wait period before data read out of a flash memory array is latched to compensate for increases in settling times caused by use of the array. Such apparatus allows the life of a flash memory array to be extended for substantial periods beyond that normally expected.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. An apparatus for controlling a period during which control circuitry of a memory array waits before latching output data comprising:

means for detecting, based on the output data, the presence of an error in the output data;

means for providing a first value to determine a wait period;

means responsive to the detection of an error for providing a second value; and means responsive to the first value for generating a signal to latch a data output from the memory array after a first period and responsive to the second value for generating a signal to latch a data output from the memory array after a second period.

2. A method for improving read reliability in a memory array comprising the steps of:

(a) initiating a read operation from the memory array;

(b) latching data provided by the read operation after a first predetermined period;

(c) checking the data provided by the read operation to determine whether the data contains an error; and (d) repeating the step of initiating the read operation from the memory array if the data provided by the read operation contains an error, and latching data after a second predetermined period, wherein the second predetermined period is longer than the first predetermined period.

3. The method of claim 2, further comprising the step of repeating the step of initiating the read operation at a next address.

4. The method of claim 2, further comprising the step of continually repeating the steps of initiating the read operation and latching data after continually longer predetermined periods until the data provided by the read operation is error-free.

5. The method of claim 2, wherein the memory array is a flash EEPROM array.

6. An apparatus for reading data from a memory array, the apparatus comprising:

a data latch which latches data from the memory array after a first period;

an error detection circuit coupled to the data latch for determining, based on the data latched from the memory array, whether the data latched from the memory array contains an error; and a control circuit coupled to the data latch and the error detection circuit which, if the error detection circuit determines the data latched from the memory array contains an error, indicates to the data latch to latch data from the memory array after a second period.

7. The apparatus of claim 6, wherein the second period is longer than the first period.

8. The apparatus of claim 6, wherein the control circuit continually repeats indicating to the data latch to latch data from the memory array after continually longer periods until the data latched from the memory array is error-free.

9. The apparatus of claim 6, further comprising data selection logic, coupled to the control circuit, for transferring an address for a read operation to the memory array.

10. The apparatus of claim 6, wherein the memory array is a flash EEPROM array.

11. A memory system comprising:

a memory array;

a lookup table including a plurality of logical sector numbers and a plurality of physical position indicators of the memory array which correspond to the plurality of logical sector numbers; and a control circuit coupled to the memory array and the lookup table which determines a physical position in the memory array of an address, wherein the control circuit transfers the physical position for a read operation to the memory array and latches data provided by the read operation after a first period, wherein the control circuit also checks the data latched from the memory array to determine whether the data contains an error, and wherein the control circuit repeats, provided the data latched does contain an error, the transfer of the physical position for the read operation to the memory array and latches data provided by the read operation after a second period, the second period being longer than the first period.

12. The system of claim 11, wherein the memory array comprises an array of Flash EEPROM memory.

* * * * *